(12) United States Patent
Gero et al.

(10) Patent No.: US 9,187,815 B2
(45) Date of Patent: Nov. 17, 2015

(54) THERMAL STABILIZATION OF COATING MATERIAL VAPOR STREAM

(75) Inventors: Peter F. Gero, Portland, CT (US); Kevin W. Schlichting, South Glastonbury, CT (US); James W. Neal, Ellington, CT (US)

(73) Assignee: United Technologies Corporation, Hartford, CT (US)

( * ) Notice: Subject to any disclaimer, the term of this patent is extended or adjusted under 35 U.S.C. 154(b) by 1086 days.

(21) Appl. No.: 12/723,405

(22) Filed: Mar. 12, 2010

(65) Prior Publication Data

US 2011/0223355 A1 Sep. 15, 2011

(51) Int. Cl.
*C23C 16/00* (2006.01)
*C23C 4/12* (2006.01)
*C23C 14/24* (2006.01)

(52) U.S. Cl.
CPC . *C23C 4/12* (2013.01); *C23C 4/121* (2013.01); *C23C 4/127* (2013.01); *C23C 4/128* (2013.01); *C23C 14/24* (2013.01)

(58) Field of Classification Search
USPC .................................................. 118/723 EB
See application file for complete search history.

(56) References Cited

U.S. PATENT DOCUMENTS

| | | | |
|---|---|---|---|
| 3,839,618 A | 10/1974 | Muehlberger | |
| 3,892,970 A * | 7/1975 | Freeman et al. | 376/105 |
| 4,233,613 A * | 11/1980 | Morimoto | 257/78 |
| 4,481,237 A | 11/1984 | Bosshart et al. | |
| 4,756,976 A * | 7/1988 | Komeya et al. | 428/698 |
| 4,944,961 A * | 7/1990 | Lu et al. | 427/531 |
| 5,296,274 A | 3/1994 | Movchan et al. | |
| 5,698,273 A * | 12/1997 | Azad et al. | 427/566 |
| 5,760,366 A * | 6/1998 | Haruta et al. | 219/121.68 |
| 5,792,521 A | 8/1998 | Wortman | |
| 5,825,123 A * | 10/1998 | Retsky | 313/413 |
| 5,869,146 A | 2/1999 | McCluskey et al. | |
| 5,897,794 A * | 4/1999 | Hubbard et al. | 219/121.12 |
| 5,942,334 A | 8/1999 | Wortman | |
| 5,998,003 A | 12/1999 | Courtright et al. | |
| 6,054,184 A | 4/2000 | Bruce et al. | |
| 6,083,322 A | 7/2000 | Burns et al. | |
| 6,210,744 B1 | 4/2001 | Hayess et al. | |
| 6,214,712 B1 * | 4/2001 | Norton | 438/591 |
| 6,217,662 B1 | 4/2001 | Kong et al. | |
| 6,365,013 B1 | 4/2002 | Beele | |
| 6,365,236 B1 | 4/2002 | Maloney | |
| 6,635,124 B1 | 10/2003 | Stowell et al. | |
| 6,677,560 B2 | 1/2004 | Eberhardt et al. | |

(Continued)

FOREIGN PATENT DOCUMENTS

EP 1 593 752 A2 9/2005
JP 59190357 A 10/1984

OTHER PUBLICATIONS

Extended European Search Report from EP Application No. 11250294.3, filed Mar. 11, 2011.

(Continued)

*Primary Examiner* — Keath Chen
(74) *Attorney, Agent, or Firm* — Kinney & Lange, P.A.

(57) ABSTRACT

A coating system includes a work piece, a coating delivery apparatus configured to apply a coating material to the work piece in a plasma-based vapor stream, and a first electron gun configured to direct a first electron beam at the plasma-based vapor stream for adding thermal energy to the coating material in the plasma-based vapor stream.

14 Claims, 2 Drawing Sheets

(56) References Cited

U.S. PATENT DOCUMENTS

| | | |
|---|---|---|
| 6,689,995 B2 | 2/2004 | Eberhardt et al. |
| 6,812,471 B2 | 11/2004 | Popiolkowski et al. |
| 6,863,999 B1 * | 3/2005 | Sudre et al. ............... 428/704 |
| 6,867,841 B2 * | 3/2005 | Nakasu et al. ............... 349/187 |
| 6,998,627 B1 * | 2/2006 | Korenev ............... 250/492.3 |
| 7,128,950 B2 | 10/2006 | Bruce et al. |
| 7,482,035 B2 | 1/2009 | Schmid et al. |
| 7,501,145 B2 | 3/2009 | Selvamanickam et al. |
| 7,579,087 B2 | 8/2009 | Maloney et al. |
| 7,622,195 B2 | 11/2009 | Schlichting et al. |
| 2004/0058188 A1 | 3/2004 | Groll |
| 2004/0089232 A1 | 5/2004 | Sasaki et al. |
| 2004/0234687 A1 | 11/2004 | Schmid et al. |
| 2006/0150891 A1 * | 7/2006 | Ichinose et al. ............... 117/2 |
| 2007/0141233 A1 | 6/2007 | Schlichting |
| 2007/0259173 A1 | 11/2007 | Refke et al. |
| 2008/0073587 A1 | 3/2008 | Schmidt et al. |
| 2008/0135753 A1 * | 6/2008 | Yamashita et al. ............ 250/310 |
| 2008/0166489 A1 | 7/2008 | Strock et al. |
| 2008/0179033 A1 * | 7/2008 | Forbes Jones ............... 164/46 |
| 2008/0226837 A1 | 9/2008 | Damani et al. |

OTHER PUBLICATIONS

Induction Atmospheres "Heating an Inconnel Susceptor for Jet Fan Blades in Argon," Applications Research Database (1 page) Retrieved Nov. 30, 2009.

Karnitz et al., "ATS Materials/Manufacturing," U.S. Department of Energy-Oak Ridge, Oak Ridge, TN, 1997 (29 pages).

Krumdieck et al., "Conversion Efficiency of Alkoxide Precursor to Oxide Films Grown by an Ultrasonic-Assisted, Pulsed Liquid Injection, Metalorganic Chemical Vapor Deposition (Pulsed-CVD) Process," J. Am. Ceram. Soc., 82 (6) 1605-07, 1999.

Tzimas, "Failure of thermal barrier coating systems under cyclic thermomemchanical loading," Acta Materialia, vol. 48, Issue 18, 2009 (abstract only).

* cited by examiner

```
START → POSITION WORK PIECE (102) → SPRAY COATING IN PLASMA-BASED VAPOR STREAM (102) → DIRECT ELECTRON BEAM(S) AT PLASMA-BASED VAPOR STREAM (104) → SCAN ELECTRON BEAM(S) (106) → DONE
```

FIG. 2

THERMAL STABILIZATION OF COATING MATERIAL VAPOR STREAM

BACKGROUND

The present invention relates to coating apparatuses and methods of applying coatings.

Coatings are utilized in a variety of settings to provide a variety of benefits. For example, modern gas turbine engines can include thermal barrier coatings (TBCs), environmental coatings, etc. to help promote efficient and reliable operation. Application of coatings can involve a variety of different application methods, such as plasma-based physical vapor deposition (PVD). When TBCs are applied to gas turbine engine components, such as blades and vanes, using plasma-based-PVD, the components being coated are rotated within a process chamber while a plasma stream directs a vapor stream of the coating material at the components. Examples of such known coating processes are disclosed in U.S. Pat. No. 7,482,035 and in U.S. Pat. App. Pub. Nos. 2007/0259173A1 and 2008/0226837A1.

A significant problem with known plasma-based PVD processes is the loss of heat. Plasma-based PVD coating processes have substantial difficulty managing spontaneous nucleation of coating particles at the periphery of the coating material vapor stream. Such spontaneous nucleation occurs at the periphery of the vapor stream where temperatures become cool enough for the formation of liquid and/or solid ceramic particles. When liquid and/or solid ceramic particles impinge the work piece, those liquid and/or solid particles detrimentally interfere with the formation and growth of desirable TBC microstructure. Specifically, solid spherical particles become entrapped in the growing TBC and disrupt desired columnar growth of ceramic crystals. A similar problem occurs when liquid ceramic impinges against the work-piece during columnar crystal growth; the development of proper TBC microstructures is disrupted by the discontinuity that results from droplets of ceramic that adhere and freeze to the work piece.

One approach known in the art for providing temperature control involves passive thermal shielding. However, passive thermal shielding mitigates only off-axis heat loss to a relatively cold process chamber. Known passive thermal shielding may be insufficient to sufficiently maintain coating materials in a vapor state for deposition on work pieces.

SUMMARY

A coating system according to the present invention includes a work piece, a coating delivery apparatus configured to apply a coating material to the work piece in a plasma-based vapor stream, and a first electron gun configured to direct a first electron beam at the plasma-based vapor stream for adding thermal energy to the coating material in the plasma-based vapor stream.

BRIEF DESCRIPTION OF THE DRAWINGS

FIG. 2 is a flow chart illustrating a coating method according to the present invention.

DETAILED DESCRIPTION

Figure 1:
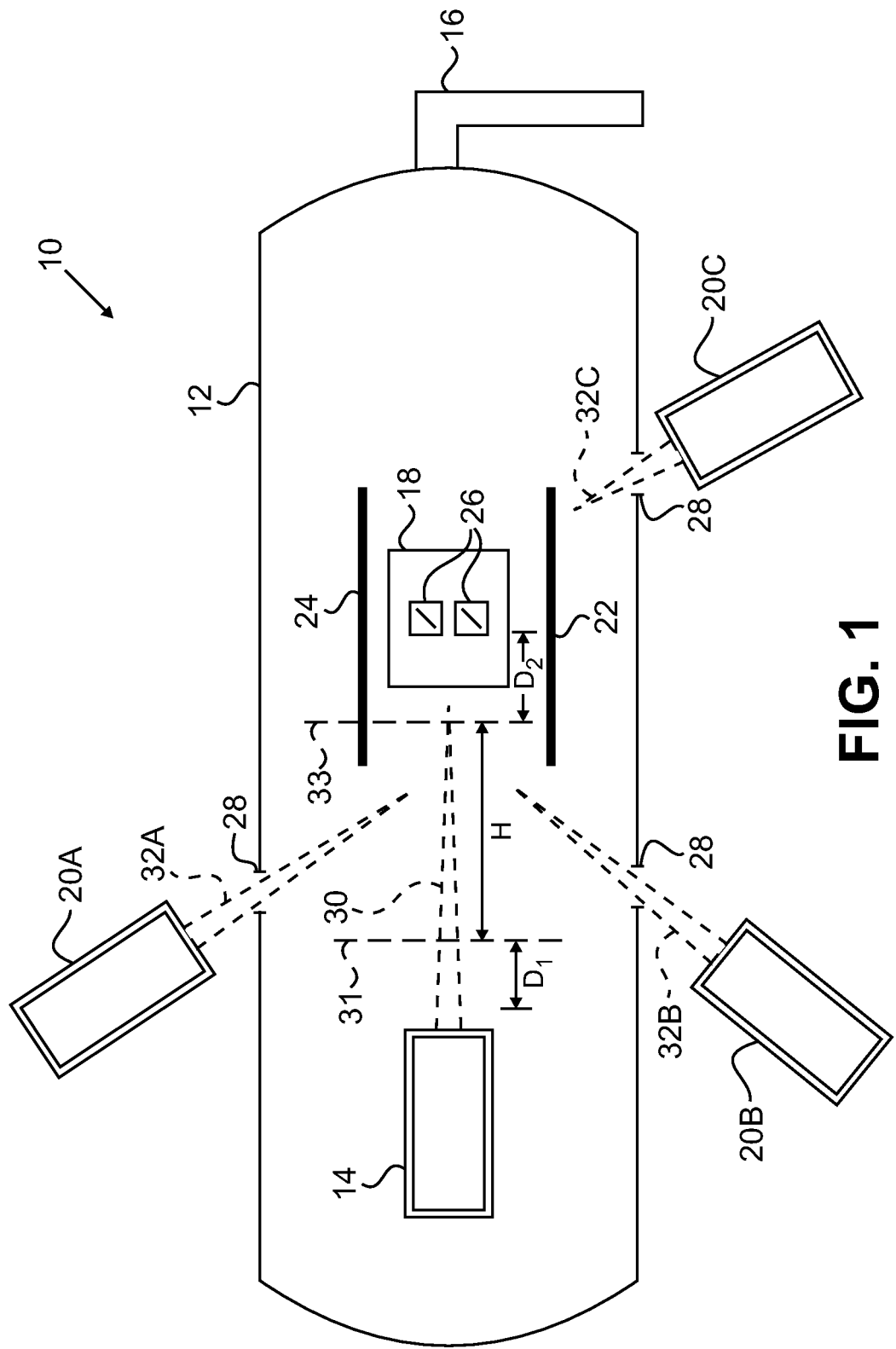
FIG. 1 is a schematic cross-sectional view of a coating system according to the present invention.

In general, the present invention provides a system and method for coating work pieces while providing thermal stabilization of a vapor stream of coating material, such as a plasma-based vapor stream of the coating material. One or more electron beams are directed at a vapor stream of coating material directed from a coating supply apparatus to one or more work pieces being coated. The electron beams can be directed to the vapor stream of the coating material within a zone defined generally downstream of a location where the coating material transitions to a vapor phase and also upstream from the work pieces being coated. The electron beams can each be scanned across a region of the vapor stream. The present invention is suitable for applying thermal barrier coatings (TBCs) to gas turbine engine components, as well as other uses.

FIG. 1 is a schematic illustration of one embodiment of a coating system 10 that includes a process chamber 12, a plasma gun 14, a pumping assembly 16, a work piece support fixture 18, electron guns 20A, 20B and 20C, a susceptor 22 and a thermal hood 24. One or more work pieces 26 desired to be coated can be secured to the work piece support fixture 18. In the illustrated embodiment, the work pieces 26 are turbine blades for a gas turbine engine, though it will be understood that the work pieces 26 can be nearly any type of component in further embodiments.

The process chamber 12 provides a contained environment for application of coating material to the work pieces 26. In the illustrated embodiment, the process chamber 12 includes fluid-cooled walls, which can be cooled with water at approximately 15-20° C. (60-70° F.). Suitable passive thermal insulation (not shown) can be provided adjacent to the walls of the process chamber 12 in a known manner. The process chamber 12 defines an interior space that is held in a vacuum (i.e., a partial vacuum), with the vacuum in the range of approximately 66.66 Pa (0.5 Torr) to approximately 1.33 kPa (10 Torr). Aerodynamic windows 28 can be formed through the walls of the process chamber 12. Such aerodynamic windows 28 can be valve-like structures that provide physical passageways through the walls of the process chamber 12 while still helping to maintain a desired pressure differential (e.g., maintaining the vacuum inside the process chamber 12).

The plasma gun 14 is typically positioned within the process chamber 12. The plasma gun 14 can be of a known type that produces a plasma jet into which a coating material, such as a ceramic TBC powder, is introduced to produce a stream 30 that includes the coating material in a vapor phase. The coating material transitions to a vapor phase, typically from a solid phase, at a location 31, which is generally spaced a distance $D_1$ from a plasma plume generated by the plasma gun 14. The stream 30 is directed toward the work pieces 26 and the work piece support fixture 18 to provide plasma-based physical vapor deposition (PVD) coating application. The plasma gun 14 is the primary source of thermal energy used to vaporize the coating material (which typically is provided in solid form). It will be appreciated by those of ordinary skill in the art that the particular composition of the coating material can vary as desired for particular applications. For instance, the coating material can be nearly any type of TBC, bond coating, environmental coating, etc. Moreover, in alternative embodiments a different type of coating supply and delivery apparatus can be substituted for the plasma gun 14, as desired for particular applications.

Excess coating material, that is, coating material not deposited on the work pieces 26, can be cooled and collected by the pumping assembly 16. In the illustrated embodiment, the pumping assembly is of a conventional configuration that allows for extraction and collection of excess coating material from the process chamber 12, as well as cooling of that excess coating material. The pumping assembly 16 is typically located at an end of the process chamber opposite the plasma gun 14. Because the pumping assembly 16 cools and removes the excess coating material, an end of the process chamber 12 where the pumping assembly 16 is located tends to exhibit cooler temperatures than in areas near the plasma gun 14.

In the illustrated embodiment, the work pieces 26 desired to be coated are secured to the work piece support fixture 18 in the path of the stream 30, downstream from the plasma gun 14. The work piece support fixture 18 can selectively index or rotate the work pieces 26 relative to the stream 30 and the plasma gun 14, in order to expose different portions of the work pieces 26 to the stream 30 in a uniform manner so that the coating material can cover all sides of the work pieces 26 substantially equally. In further embodiments, the support fixture 18 can move the work pieces 26 in a more complex manner, such as a planetary-type motion.

The electron guns 20A, 20B and 20C can each be positioned outside the process chamber 12, and can generate electron beams 32A, 32B and 32C, respectively, directed into the process chamber 12 through the aerodynamic windows 28. The electron guns 20A, 20B and 20C can be differentially-pumped. Furthermore, locating the electron guns 20A, 20B and 20C outside of the process chamber 12 allows those guns 20A, 20B and 20C to be maintained at a different—and typically lower—operating pressure than the vacuum maintained inside the process chamber 12. Each of the electron guns 20A, 20B and 20C can have magnetic coils or other mechanisms used to control and direct the electron beams 32A, 32B and 32C in a desired manner, such as to allow scanning of the electron beams 32A, 32B and 32C in a rasterized fashion.

The electron guns 20A and 20B direct the corresponding electron beams 32A and 32B to a region H of the stream 30. The region H is defined between the location 31, which is downstream of the plasma gun 14, and a location 33, which is located upstream of the work pieces 26. The location 33 is spaced (upstream) from the work pieces 26 by a distance $D_2$. By directing the electron beams 32A and 32B from the electron guns 20A and 20B to the region H, thermal energy is added to the stream 30 generally downstream from where the coating material transitions to the vapor phase (at the location 31) and also a suitable distance ($D_2$) upstream from the work pieces 26 to lessen a risk of overheating or otherwise damaging the work pieces 26.

The susceptor 22 is positioned within the process chamber 12 generally adjacent to the work piece support fixture 18 and the work pieces 26. The susceptor 22 can be made of an oxide-based ceramic material, and can have any desired shape. In one embodiment, the susceptor 22 is shaped as a tray and is positioned substantially parallel to the work pieces 26 (e.g., parallel to a spanwise-extending portion of a turbine blade work piece). The effectiveness of oxide-based ceramic susceptors is generally not degraded by deposition of ceramic coating material, thereby enhancing compatibility of the susceptor 22 with a ceramic deposition process such as with ceramic-based TBC deposition. Other materials, such as metallic materials, can also be used to make the susceptor 22 in further embodiments.

During operation, the electron gun 20C directs the electron beam 32C at the susceptor 22. Although one electron gun 20C is shown directed at the susceptor 22 in the illustrated embodiment, additional electron guns can be directed at the susceptor 22 in further embodiments. The electron gun 20C can scan the electron beam 32C across at least portions of the susceptor 22, thereby allowing the electron beam 32C to remain relatively focused while still directing energy to a relatively large area of the susceptor 22. The electron beam 32C causes the susceptor 22 to radiate heat, and the susceptor 22 can be positioned such that the radiating heat is directed toward the work piece support fixture 18 to heat the work pieces 26. The additional heat generated by the susceptor 22 helps to thermally stabilize the work pieces 26, and reduce cyclical heat and cooling effects caused by rotation of the work pieces 26 relative to the plasma gun 14 and the stream 30. The electron gun 20C can be positioned such that the electron beam 32C can reach the susceptor 22 without crossing the stream 30, including related plumes of the coating material present inside the process chamber 12. The coating material in the stream 30 would tend to obstruct the electron beam 32C and thereby decrease the amount of energy delivered to the susceptor 22.

The thermal hood 24 is positioned inside the process chamber 12 to partially surround the work piece support fixture 18 and the work pieces 26 to provide thermal shielding to help maintain thermal stabilization of the work pieces 26. The thermal hood 24 can be positioned generally opposite to the susceptor 22. In one embodiment, the thermal hood 24 is configured to provide reflective infrared shielding. In some embodiments, the thermal hood 24 can be moveable (using any suitable actuation mechanism) to further help regulate thermal conditions in the process chamber 12. In further embodiments, the susceptor 22 and/or the thermal hood 24 can be omitted.

FIG. 2 is a flow chart illustrating one embodiment of a coating method. At least one work piece is positioned within a process chamber, typically supported by a movable support member (step 100). A coating material, such as a ceramic TBC, is sprayed at one or more work pieces in a plasma-based vapor stream (step 102). One or more electron beams from a corresponding number of electron guns are directed at the vapor stream of the coating material (step 104). The electron beams can be focused on the vapor stream of the coating material within a zone defined generally downstream of a location where the coating material transitions to a vapor phase and also upstream from the work pieces being coated. The electron beam(s) directed at the vapor stream can optionally be scanned across a region of the vapor stream, such as in a rasterized manner (step 106). Optionally, an additional electron beam from an additional electron gun can be directed at a susceptor that radiates heat toward the work piece. Furthermore, heat within the process chamber can be reflected back toward the work piece with an optional thermal hood.

It will be recognized that the present invention provides numerous advantages and benefits. For example, direct thermal stabilization of a vapor stream of coating material can help reduce spontaneous nucleation of coating particles, in particular at the periphery of the coating material vapor stream, which can have an adverse effect on desired coating microstructure (e.g., columnar microstructures) of the resultant coated work pieces in prior art systems. Thermal energy added to the vapor stream of the coating material helps to maintain the coating material in the vapor phase.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A coating system comprising:
   a work piece;
   a coating delivery apparatus configured to apply a coating material to the work piece in a plasma-based vapor stream;
   a first electron gun configured to direct a first electron beam at the plasma-based vapor stream at a region of the plasma-based vapor stream that extends from a location downstream from the coating delivery apparatus where the coating material transitions to vapor phase to a location upstream from the work piece for adding thermal energy to the coating material in the plasma-based vapor stream, wherein the first electron gun is further configured to scan the first electron beam across at least a portion of the region of the plasma-based vapor stream;
   a susceptor positioned adjacent to the work piece; and
   a susceptor-directed electron gun configured to direct an electron beam at the susceptor such that the susceptor radiates heat toward the work piece.

2. The coating system of claim 1 and further comprising:
   a process chamber, wherein the coating delivery apparatus and the work piece are each positioned at least partially within the process chamber.

3. The coating system of claim 2, wherein an interior of the process chamber is maintained in a vacuum.

4. The coating system of claim 3 and further comprising:
   an aerodynamic window defined through a wall of the process chamber, wherein the first electron gun is located outside the process chamber and positioned to direct the first electron beam through the aerodynamic window to the plasma-based vapor stream.

5. The coating system of claim 1 and further comprising:
   a second electron gun configured to direct a second electron beam at the plasma-based vapor stream for adding thermal energy to the coating material in the plasma-based vapor stream.

6. The coating system of claim 5 and further comprising:
   an aerodynamic window defined through a wall of the process chamber, wherein the second electron gun is located outside the process chamber and positioned to direct the second electron beam through the aerodynamic window to the plasma-based vapor stream.

7. The coating system of claim 1, wherein the coating material comprises a thermal barrier coating, and wherein the work piece comprises a gas turbine engine component.

8. The coating system of claim 1, wherein the susceptor comprises a ceramic material.

9. The coating system of claim 1, wherein the susceptor is positioned substantially parallel to the plasma-based vapor stream.

10. A coating system comprising:
    a work piece;
    a plasma gun configured to apply a coating material to the work piece in a plasma-based vapor stream;
    a process chamber, wherein the plasma gun and the work piece are each positioned at least partially within the process chamber;
    a first electron gun configured to direct a first electron beam at the plasma-based vapor stream for adding thermal energy to the coating material in the plasma-based vapor stream, wherein the first electron gun is further configured to scan the first electron beam across a region of the plasma-based vapor stream that extends downstream from a plasma plume of the plasma gun at a location where the coating material transitions to vapor phase to a location upstream from the work piece; a susceptor positioned adjacent to the work piece; and
    a susceptor-directed electron gun configured to direct an electron beam at the susceptor such that the susceptor radiates heat toward the work piece.

11. The coating system of claim 10, wherein an interior of the process chamber is maintained in a vacuum, the coating system further comprising:
    an aerodynamic window defined through a wall of the process chamber, wherein the first electron gun is located outside the process chamber and positioned to direct the first electron beam through the aerodynamic window to the work piece.

12. The coating apparatus of claim 10 and further comprising:
    a second electron gun configured to direct a second electron beam at the plasma-based vapor stream for adding thermal energy to the coating material in the plasma-based vapor stream.

13. A coating method using the coating system of claim 1 or 10, the coating method comprising:
    positioning a work piece in a process chamber;
    spraying a coating material in a plasma-based vapor stream from a coating supply location onto the work piece;
    directing a first electron beam at the plasma-based vapor stream to add thermal energy to the coating material in the plasma-based vapor stream; and
    scanning the first electron beam across the plasma-based vapor stream.

14. The coating method of claim 13 and further comprising:
    directing a second electron beam at the plasma-based vapor stream to add thermal energy to the coating material in the plasma-based vapor stream.

* * * * *